(12) United States Patent
Niu et al.

(10) Patent No.: US 10,852,855 B2
(45) Date of Patent: Dec. 1, 2020

(54) SMART WATCH INTERACTING METHOD, SMART WATCH AND PHOTOELECTRIC ROTARY KNOB ASSEMBLY

(71) Applicant: COROS SPORTS TECHNOLOGY (SHENZHEN) CO., LTD, Guangdong (CN)

(72) Inventors: Haotian Niu, Guangdong (CN); Huicong Zhang, Guangdong (CN); Jiaxin Liu, Guangdong (CN); Heng Wang, Guangdong (CN); Yu Tang, Guangdong (CN); Zhonghe Chen, Guangdong (CN)

(*) Notice: Subject to any disclaimer, the term of this patent is extended or adjusted under 35 U.S.C. 154(b) by 0 days.

(21) Appl. No.: 16/679,333

(22) Filed: Nov. 11, 2019

(65) Prior Publication Data

US 2020/0167010 A1    May 28, 2020

Related U.S. Application Data

(63) Continuation of application No. PCT/CN2018/090092, filed on Jun. 6, 2018.

(51) Int. Cl.

| | |
|---|---|
| *G06F 3/0362* | (2013.01) |
| *G04G 17/04* | (2006.01) |
| *G04G 21/00* | (2010.01) |
| *G06F 3/03* | (2006.01) |
| *G06F 3/0485* | (2013.01) |

(52) U.S. Cl.
CPC .......... *G06F 3/0362* (2013.01); *G04G 17/04* (2013.01); *G04G 21/00* (2013.01); *G06F 3/0312* (2013.01); *G06F 3/0485* (2013.01); *G06F 2203/04806* (2013.01)

(58) Field of Classification Search
None
See application file for complete search history.

(56) References Cited

U.S. PATENT DOCUMENTS

| | | | |
|---|---|---|---|
| 6,556,222 B1* | 4/2003 | Narayanaswami | G04G 9/0064 368/295 |
| 2017/0089735 A1* | 3/2017 | Ruh | G04C 3/005 |
| 2017/0139489 A1 | 5/2017 | Chen et al. | |
| 2017/0329511 A1* | 11/2017 | Ueno | G06F 3/04883 |
| 2019/0101870 A1* | 4/2019 | Pandya | A61B 5/02427 |

FOREIGN PATENT DOCUMENTS

| | | |
|---|---|---|
| CN | 104020660 A | 9/2014 |
| CN | 105339871 A | 2/2016 |
| CN | 105547146 A | 5/2016 |
| CN | 105556433 A | 5/2016 |
| CN | 106125968 A | 11/2016 |
| CN | 205403811 U | 7/2017 |
| CN | 107430383 A | 12/2017 |

OTHER PUBLICATIONS

International search report of PCT/CN2018/090092.

* cited by examiner

*Primary Examiner* — Matthew Yeung
(74) *Attorney, Agent, or Firm* — ZANIP

(57) ABSTRACT

A smart watch interacting method comprises: obtaining a rotation direction and rate information of a rotary knob; obtaining a displacement information of the rotary knob; querying an interacting mapping library to determine an operation instruction according to the rotation direction and rate information and the displacement information of the rotary knob; and displaying an interacting operation on the user interface according to the operation instruction.

8 Claims, 3 Drawing Sheets

SMART WATCH INTERACTING METHOD, SMART WATCH AND PHOTOELECTRIC ROTARY KNOB ASSEMBLY

CROSS-REFERENCE TO RELATED APPLICATION

This application is a continuation of PCT application No. PCT/CN2018/090092, filed on Jun. 6, 2018. The patent application is hereby incorporated by reference in its entirety.

TECHNICAL FIELD

The present disclosure relates to the field of wearable devices, more particularly, to a smart watch interacting method, a smart watch and a photoelectric rotary knob assembly.

BACKGROUND

As wearable devices, smart watches are favored by users for information processing ability and portability thereof, and meeting the users' requirement to wear watches.

Existing smart watches generally use liquid crystal display, which not only indicates the time, but also provides enriching user interface functions such as reminder, navigation, calibration, monitoring and interaction.

However, the LCD screens of smart watches are narrow and small, which fail to interact with touch screens like mobile terminals with bigger screens such as mobile phones, such as dragging scroll bars or zooming in display contents.

Chinese patent application NO. 201710004698.8 discloses a smart watch control method and device. The method includes: receiving a touch input on the touch sensitive surface of the smart watch; determining an operation location of the touch input; if the operation location of the touch input is in a preset interactive area, operation instructions of the touch input are determined according to a graphical user interface currently displayed in the interactive area; if the operation location of the touch input is in the preset control area, the operation instructions of the touch input are determined according to operation data of the touch input; executing the operation instructions.

However, in the existing smart watch control methods, the users have to touch the screen on the watch dial plate to complete the interactions, and the watch dial plate has a small area. For a multi-task selection, the users have to operate back and forth on the touch-sensitive surface of the smart watch. For example, one cannot slide the interface up and down fast enough. Moreover, the touch screen on the touch-sensitive surface is not precise enough, and the screen of the smart watch is small, so there are very few interactive modes that the touch-sensitive surface may realize. How to combine traditional watch design principle with operational and control convenience has become an urgent problem to be dealt with for current smart watches.

Therefore, the existing smart watch operation and control technique is still desirable to be improved and developed.

SUMMARY

Embodiments of the present application provide a smart watch interacting method, a smart watch and a photoelectric rotary knob assembly which are capable of performing a plurality of operations on a watch user interface precisely and sensitively via a rotary knob in combination with design principle of a traditional watch crown.

Firstly, an embodiment of the present application provides a smart watch interacting method, which comprises:

Obtaining a rotation direction and rate information of a rotary knob.

Obtaining a displacement information of the rotary knob.

Querying an interacting mapping library to determine an operation instruction according to the rotation direction and rate information and the displacement information of the rotary knob.

Displaying an interacting operation on the user interface according to the operation instruction.

Where obtaining the rotation direction and rate information comprises obtaining the rotation direction and rate information via a photoelectric sensor; obtaining the displacement information of the rotary knob comprises obtaining the displacement information of the rotary knob via the photoelectric sensor.

The photoelectric sensor comprises a laser light source unit and an image detecting unit, the laser light source unit emitting laser light and illuminating on a surface of the rotary knob, the image detecting unit determining the rotation direction and rate information of the rotary knob based on the light reflected by the surface of the rotary knob.

Preferably, the interacting mapping library is a mapping library between rotary knob operations and operation instructions, in which a clockwise rotation of the rotary knob corresponds to an upward page-turning instruction, an upward scrolling instruction, an number increasing scrolling instruction, or a zoom-out instruction; an anticlockwise rotation of the rotary knob corresponds to a downward page-turning instruction, a downward scrolling instruction, a number reducing scrolling instruction, or a zoom-in instruction; a rate of the clockwise rotation of the rotary knob corresponds to an upward page-turning rate, an upward scrolling rate or a zoom-out magnification; a rate of the anticlockwise rotation of the rotary knob corresponds to a downward page-turning rate, a downward scrolling rate or a zoom-in magnification; a change of a pressing displacement of the rotary knob corresponds to a confirming function of an enter key.

Secondly, an embodiment of the present application provides a smart watch which comprises a controller, an LCD interface connected to the controller, wherein the smart watch further comprises a photoelectric rotary knob assembly having a rotary knob; the controller comprises an obtaining module, a mapping module and an interacting module.

The obtaining module is configured to obtain a rotation direction and rate information of the rotary knob, and obtain a displacement information of the rotary knob.

The mapping module is configured to query an interacting mapping library to determine an operation instruction according to the rotation direction and rate information and the displacement information of the rotary knob;

The interacting module is configured to display an interacting operation on the LCD interface according to the operation instruction.

The photoelectric rotary knob assembly further comprises a photoelectric sensor connected to the controller, the photoelectric sensor being configured to obtain the rotation direction and rate information of the rotary knob, and further configured to obtain the displacement information of the rotary knob.

Preferably, the photoelectric sensor comprises a laser light source unit and an image detecting unit, the laser light source unit emitting laser light and illuminating on a surface of the rotary knob, the image detecting unit determining the rotation direction and rate information of the rotary knob based on the light reflected by the surface of the rotary knob.

Where the interacting mapping library is a mapping library between rotary knob operations and operation instructions, in which a clockwise rotation of the rotary knob corresponds to an upward page-turning instruction, an upward scrolling instruction, an number increasing scrolling instruction, or a zoom-out instruction; an anticlockwise rotation of the rotary knob corresponds to a downward page-turning instruction, a downward scrolling instruction, a number reducing scrolling instruction, or a zoom-in instruction; a rate of the clockwise rotation of the rotary knob corresponds to an upward page-turning rate, an upward scrolling rate or a zoom-out magnification; a rate of the anticlockwise rotation of the rotary knob corresponds to a downward page-turning rate, a downward scrolling rate or a zoom-in magnification; a change of a pressing displacement of the rotary knob corresponds to a confirming function of an enter key.

Thirdly, an embodiment of the present application provides a photoelectric rotary knob assembly, which is mounted on a watch case and comprises a rotary knob and a photoelectric sensor; the rotary knob comprises a rotary cap and a detection rod extending from the rotary cap, the detection rod extending into the photoelectric sensor, the photoelectric sensor being connected to the controller, wherein the photoelectric sensor is configured to obtain a rotation direction and rate information of the detection rod, and obtain a displacement information of the detection rod; the controller is configured to query an interacting mapping library to determine an operation instruction according to the rotation direction and rate information and the displacement information, and display an interacting operation on the LCD interface according to the operation instruction.

Preferably, the watch case forms a crown tube, a mounting ring slot arranged at a concave around the crown tube; the rotary cap forms a ring receiving chamber; the detection rod of the rotary knob passes through the crown tube such that the crown tube is received in the receiving chamber; at the same time, an elastic element is mounted between the mounting ring slot and the rotary cap.

Preferably, an inner side of the crown tube is provided with at least one seal ring, and a jump ring is arranged where the detection rod passes through the watch case.

Where the interacting mapping library is a mapping library between rotary knob operations and operation instructions, in which a clockwise rotation of the rotary knob corresponds to an upward page-turning instruction, an upward scrolling instruction, an number increasing scrolling instruction, or a zoom-out instruction; an anticlockwise rotation of the rotary knob corresponds to a downward page-turning instruction, a downward scrolling instruction, a number reducing scrolling instruction, or a zoom-in instruction; a rate of the clockwise rotation of the rotary knob corresponds to an upward page-turning rate, an upward scrolling rate or a zoom-out magnification; a rate of the anticlockwise rotation of the rotary knob corresponds to a downward page-turning rate, a downward scrolling rate or a zoom-in magnification; a change of a pressing displacement of the rotary knob corresponds to a confirming function of an enter key.

In a specific embodiment, the photoelectric sensor comprises a laser light source unit and an image detecting unit, the laser light source unit emitting laser light and illuminating on a surface of the rotary knob, the image detecting unit determining the rotation direction and rate information of the rotary knob based on the light reflected by the surface of the rotary knob.

Beneficial Effect

Beneficial effect of the embodiments of the present application includes: in the smart watch interacting method, the smart watch and the photoelectric rotary knob assembly of the embodiments, the photoelectric sensor is used in combination with design principle of a traditional watch crown. By capturing different rotary knob actions on the rotary knob with the photoelectric sensor, determining systematic operations corresponding to the rotary knob actions and displaying interacting operations on the user interface of the smart watch, the interactive control is completed. The smart watch of the embodiments may slide the user interface upwards and downwards, and realize zoom-in and zoom out functions precisely and sensitively by operating the rotary knob hardware. The bottleneck problem of touch screen interaction brought by small size of the smart watch screen may be solved by hardware interactions with high-precision interactive controls and simple operations.

BRIEF DESCRIPTION OF DRAWINGS

One or more embodiments would be illustrative with reference to the figures in the accompanying drawings corresponding thereto. However, these illustrative descriptions do not constitute limitation to the embodiments, and the elements in the accompanying drawings with the same reference number label represent similar elements, and the figures in the accompanying drawings do not constitute proportionality limitation unless otherwise indicated.

DETAILED DESCRIPTION

In order to illustrate the purpose, technical solutions and the advantages of the present application more clearly, the present application will be described below in further details with reference to the drawings and embodiments. It is to be understood that specific embodiments described herein are merely for explaining, instead of limiting the present application.

The present application provides a photoelectric rotary knob assembly which comprises a rotary knob and a photoelectric sensor, and combines the photoelectric sensor with design principle of a traditional watch crown. The photoelectric sensor senses and calculates the actions of the rotary knob. A corresponding relationship between actions of the rotary knob and operation instructions of an operation system is establish, and a corresponding relationship between the actions of the rotary knob and operations of a user interface from different applications is established, such that a rotary knob operation key function of a high-precision smart watch is achieved, and the problems of excessive keys and complex operations of the existing smart watch are solved. The rotary knob hardware interactive mode of the present application is not limited by the touch screen of the smart watch and possess high-precision interactive control. A user may use the smart watch normally while in gloves or with water in hands.

First Embodiment

The present embodiment concerns a smart watch, and technical solutions of the present application would be introduced starting from the hardwire structure of the smart watch.

Figure 3:
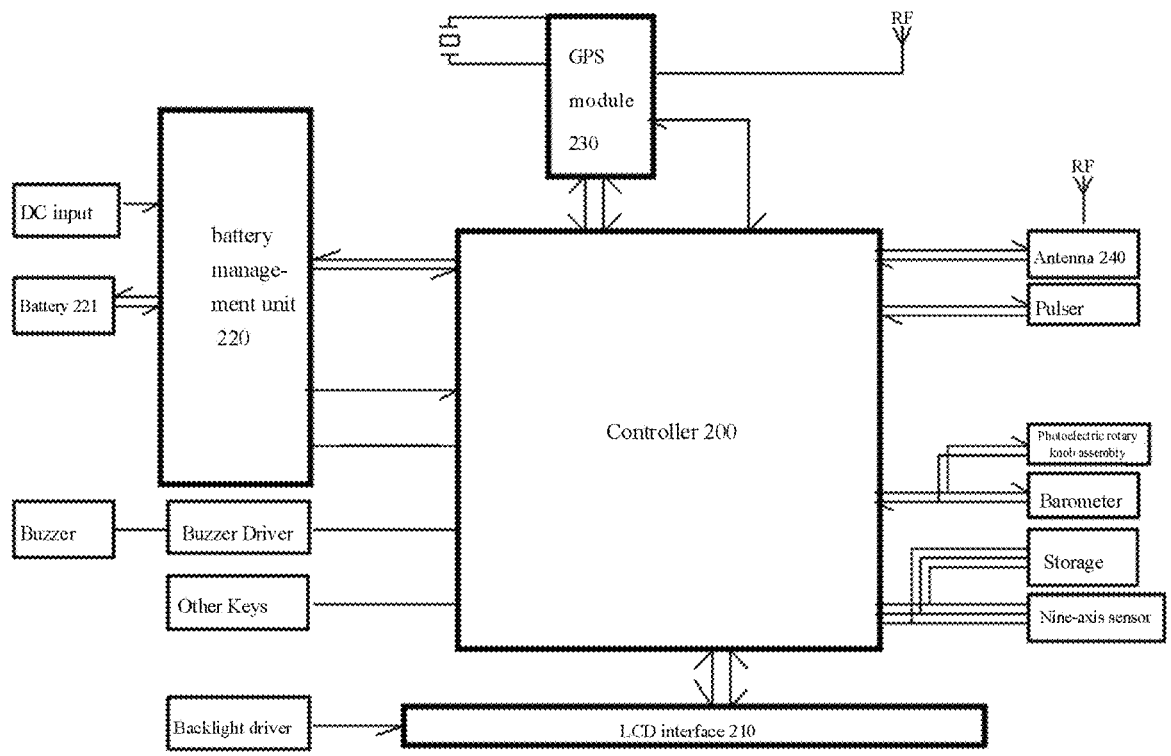
FIG. 3 is a circuit structural view of a smart watch provided by an embodiment of the present application.

Referring to FIG. 3, the smart watch in the present embodiment comprises a controller 200, an LCD interface 210 connected to the controller, a battery management unit 220, a GPS module 230, and an antenna 240. The controller 200 further comprises a photoelectric rotary knob assembly. System software runs on the controller such that the LCD interface 210 may display image user interface for different applications. The controller 200 is connected to a storage to ensure that software stored in the storage and run by the controller may realize key action identification and interactive display for different application user interfaces of the present application.

Figure 4:
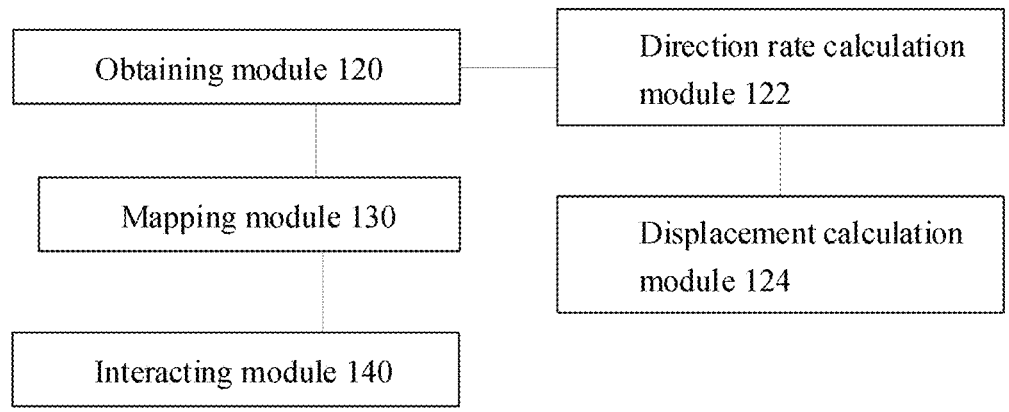
FIG. 4 is a processing module view of a smart watch interacting method provided by an embodiment of the present application.

Referring further to FIG. 4, in order to realize action identification of the rotary knob 20 and corresponds to operations on the user interface synchronously, the storage stores therein, alternatively, the controller includes, an obtaining module 120, a mapping module 130 and an interacting module 140. In a specific design, the obtaining module 120 may be further divided into a direction rate calculation module 122 and a displacement calculation module 124.

The photoelectric sensor 60 comprises a laser light source unit 65 and an image detecting unit 67. The laser light source unit 65 emits laser light and illuminates on a surface of the rotary knob 20. The surface of the rotary knob 20 is not a perfect mirror surface. The image detecting unit 67 determines the rotation direction and rate information of the rotary knob 20 based on the light reflected by the surface of the rotary knob 20. The image detecting unit 67 may be a light sensor.

The laser light source unit 65 and the image detecting unit 67 are both arranged inside a three-dimensional sensing chamber formed by the photoelectric sensor 60, such as an X axis, a Y axis and a Z axis. The laser light source emits detection light, and the photoelectric obtains the image information of the rotary knob 20 continuously, then distinguishes the difference between adjacent images, and then calculates the actions and displacement relative to the rotary knob 20.

The obtaining module 120 is configured to obtain an image information via the photoelectric sensor; the direction rate calculation module 122 calculates a rotation direction and rate information of a rotary knob, such as rotary rate on the surface of X and Y axis. The rate may be linear speed or angular speed, and whether the value of the rate is positive or negative may determine the rotary direction.

The displacement calculation module 124 is configured to calculate the displacement information of the rotary knob, such as the displacement information on the Z axis.

The mapping module 130 is configured to query an interacting mapping library to determine an operation instruction according to the rotation direction and rate information and the displacement information of the rotary knob.

The interacting module 140 is configured to display an interacting operation of user interfaces for different applications on the LCD interface 210 according to the operation instruction.

Where the interacting mapping library is a mapping library between rotary knob 20 operations and operation instructions, in which a clockwise rotation of the rotary knob 20 corresponds to an upward page-turning instruction, an upward scrolling instruction, an number increasing scrolling instruction, or a zoom-out instruction; an anticlockwise rotation of the rotary knob 20 corresponds to a downward page-turning instruction, a downward scrolling instruction, a number reducing scrolling instruction, or a zoom-in instruction; a rate of the clockwise rotation of the rotary knob 20 corresponds to an upward page-turning rate, an upward scrolling rate or a zoom-out magnification; a rate of the anticlockwise rotation of the rotary knob 20 corresponds to a downward page-turning rate, an downward scrolling rate or a zoom-in magnification; a change of the pressing displacement of the rotary knob 20 corresponds to a confirming function of an enter key.

Structure of the photoelectric rotary knob assembly will be described specifically below.

Figure 5:
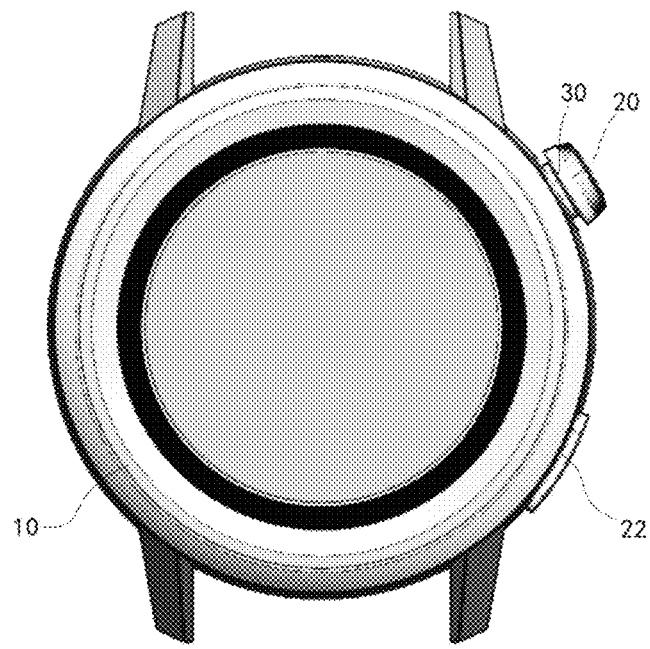
FIG. 5 is an embodied external view of the smart watch provided by an embodiment of the present application.
Figure 6:
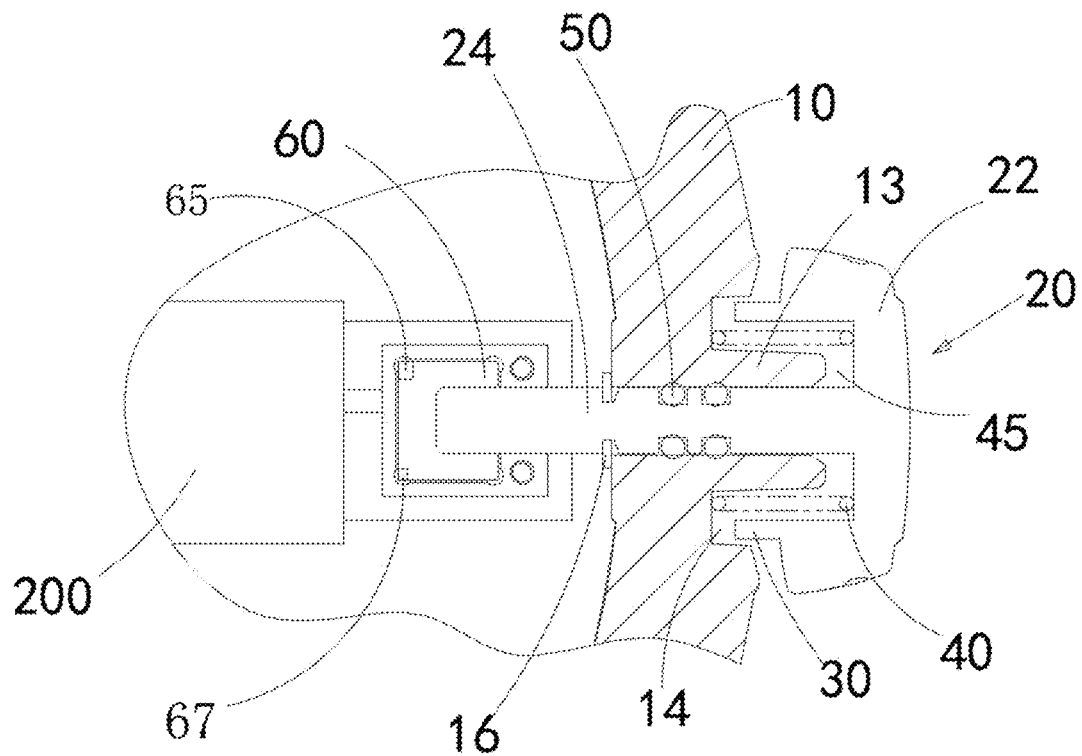
FIG. 6 is a section view of a photoelectric rotary knob assembly provided by an embodiment of the present application.

With reference to FIGS. 5 and 6, the photoelectric rotary knob assembly in the present embodiment is simple in structural design with good hand feeling while operating the key of the rotary knob. The smart watch in FIG. 5 includes a watch case and a movement mounted between the watch case 10 and a bottom cover. The movement includes a controller 200. The crown and the key, such as the key 22 of the smart watch are arranged on the watch case. In the embodiment, the crown and the photoelectric sensor are combined, designing a new photoelectric rotary knob assembly.

The photoelectric rotary knob assembly is mounted on the watch case 10 of the smart watch. The watch case 10 extends to form a crown tube 13 for mounting the photoelectric rotary knob assembly. The crown tube 13 and the watch case 10 may be molded in one body. In another embodiment, the crown tube 13 may also be an independent element assembled on the watch case 10.

The photoelectric rotary knob includes a rotary knob 20, an elastic element 40, a seal ring 50, a jump ring 16 and a photoelectric sensor 60. A mounting ring slot 14 is formed and dented around the crown tube where the watch case 10 extends to the crown tube 13. In the present embodiment, the elastic element 40 is a spring.

The rotary knob 20 comprises a rotary cap 22 and a detection rod 24 extending from the rotary cap 22. The detection rod 24 passes through the crown tube 13 formed by the watch case 10 and extends into the photoelectric sensor 60. Two edges of the rotary cap 22 extend towards on side of the detection rod 24 to form a rotary knob external cap 30. A ring receiving chamber 45 is formed between the rotary knob external cap 30 and the detection rod 24. The ring 40 is received in the ring receiving chamber 45, and sleeved around the crown tube 13 so as to provide elastic restoring force for the rotary knob 20. In the present embodiment, the detection rod 24 is a metal rod. The detection rod 24 of the rotary knob 20 passes through the crown tube 13 and locates the crown tube 13 inside the receiving chamber 45. Meanwhile, the elastic element 40 is arranged between the mounting ring slot 14 and the rotary knob external cap 30 of the rotary cap 22.

The seal ring 50 is arranged in an inner chamber of the crown tube 13, and cooperates with the crown tube 13 for use. After the detection rod 24 is mounted to the watch case 10, the waterproof function of a cell and a rotary damper function of the detection rod 24 may be realized.

To better ensure seal effect, a jump ring 16 is arranged where the detection rod 24 passes through the inner side of the watch case 10. In the present application, the seal ring 50, as a waterproof ring, performs waterproof and damper functions. The elastic element 40 may be mounted outside the watch case 10, or designed inside the watch case 10. Therefore, assembly structure of the photoelectric rotary assembly may be realized in different design styles.

The photoelectric sensor 60 comprises a laser light source unit 65 and an image detecting unit 67. The laser light source unit 65 emits laser light and illuminates on a surface of the rotary knob 20. The image detecting unit 67 determines the rotation direction and rate information of the rotary knob 20 based on the light reflected by the surface of the rotary knob. The laser light source unit 65 and the image detecting unit 67 are both arranged inside a three-dimensional sensing chamber formed by the photoelectric sensor 60, such as an X axis, a Y axis and a Z axis. After the detection rod 24 is provided with the photoelectric sensor 60, the photoelectric sensor 60 may collect the three-dimensional image information of the detection rod 24 inside the sensing chamber.

The photoelectric sensor 60 is connected to the controller 200. The photoelectric sensor 60 is configured to obtain rotary direction and rate information of the detection rod 24, and obtain the three-dimensional image information of the displacement information of the detection rod 24. The controller 200 is configured to query an interacting mapping library to determine an operation instruction according to the rotation direction and rate information and the displacement information, and display an interacting operation on the LCD interface 210 according to the operation instruction.

Working principles for collecting the image information to determine the actions of the detection rod 24 between the photoelectric sensor 60 and the detection rod 24 are: the photoelectric sensor 60 is a reflective sensor. The photoelectric sensor 60 collects image information of the detection rod 24 in a preset frequency using the laser light source. Laser light illuminates on the rotary surface of the detection rod 24. The rotary knob 20 is rotated. Since the surface of the detection rod 24 is not a perfect mirror surface, when the rotary knob 20 is rotated and pressed, the X and Y axes are displaced at the same time. Upon algorithm processing of the obtaining module 120, a relative displacement distance is output, and the rotary direction and rate is determined based on the light reflected from the surface of the rotary knob. While calculating the rotary rate on the surface of X and Y axes, whether the value of the rotary rate is positive or negative may determine the rotary direction. According to design requirement for the smart watch, the tracking rate of the photoelectric sensor 60 to the detection rod 24 may reach 300 circles per minute maximally.

When the rotary knob 20 is pressed inwards, detection principle thereof is similar. The only difference is the moving direction of the detection rod 24, for example, analyzing and calculating the displacement information of the Z axis. Then, information difference between adjacent images is compared, and a relative displacement distance is calculated based on the difference. When the photoelectric sensor 60 senses the rotation of the detection rod 24, a concave in the surface of the detection rod 24 will change in the three-dimensional image, and the direction rate calculation module 122 and the displacement calculation module 124 may calculate the interactions corresponding to the detection rod 124 based on the image information.

Figure 2:
FIG. 2 is a schematic view of a user interface in one application of a smart watch provided by an embodiment of the present application.

In the photoelectric rotary knob assembly of the present embodiment, in the user operation process, upward and downward sliding of the rotary knob may adjust the rate or scale of the user interface with a wide adjusting range, and the operation precision is higher with more exquisite experience if used in combination with the photoelectric sensor. At the same time, fingers would not block the LCD interface 210 of the watch, such as, an LCD touch screen, in the operation process. As shown in FIG. 2, when a user rolls a specific user interface of an application fast, such as the scroll bars 101 and 102 of the page 103, when rotary knob 20 is pressed on the right side, pressing the rotary knob downwards may realize an enter key function, which may select the scroll bar 101 or 102. Then, rotating the rotary knob 20 upwards and downwards may realize scrolling of the scroll bar 101 or 102, or page-turning of the page 103. The operation is sensitive and the interaction experience is more delightful.

Second Embodiment

Figure 1:
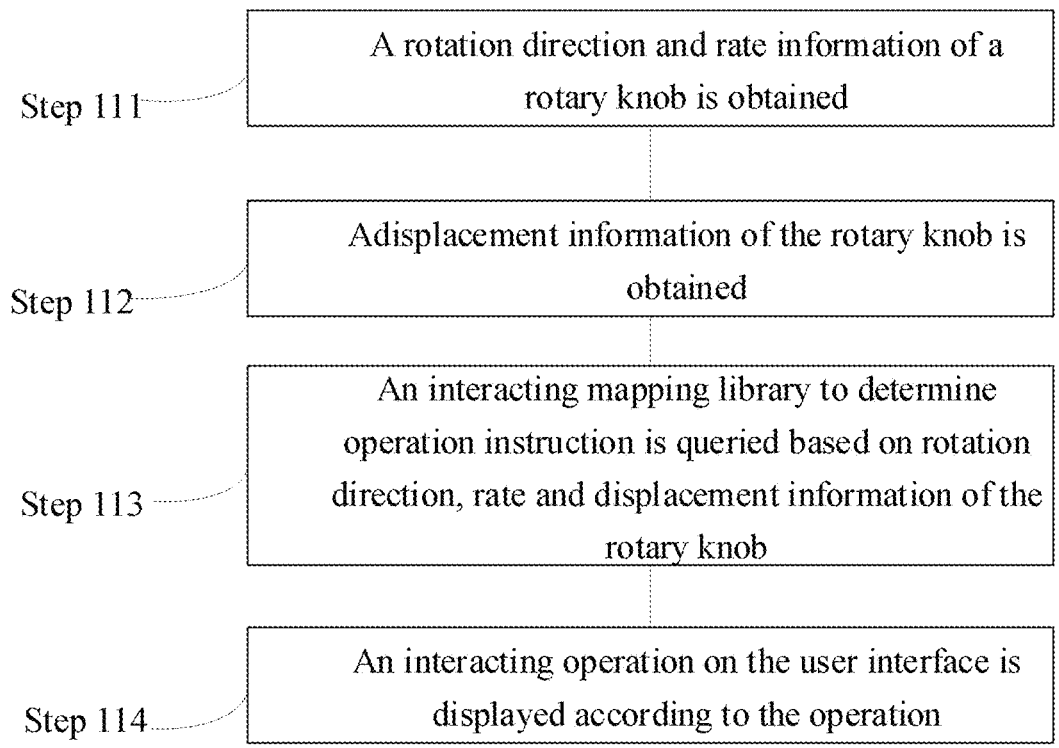
FIG. 1 is a processing flow chart of a smart watch interacting method provided by an embodiment of the present application.

Referring to FIG. 1, the embodiment concerns a smart watch interacting method. The smart watch interacting method includes logical methods for interacting operations realized by the controller and software stored in a storage. The smart watch interacting method of the present application will be introduced based in software level.

The smart watch interacting method includes the following steps:

At step 111, a rotation direction and rate information of a rotary knob is obtained; a user may operate with the abovementioned photoelectric rotary assembly, and image data may be collected and operated by the photoelectric sensor.

At step 112, a displacement information of the rotary knob is obtained; a user may operate with the abovementioned photoelectric rotary assembly; and image data may be collected and operated by the photoelectric sensor.

At step 113, an interacting mapping library to determine an operation instruction is queried according to the rotation direction and rate information and the displacement information of the rotary knob; the interacting mapping library is stored in the storage, and may be updated online; the obtaining module of the controller receives sequential image information collected by the photoelectric sensor, and analyzes and calculates actions and operation instructions of the user upon the rotary knob.

At step 114, an interacting operation on the user interface is displayed according to the operation instruction.

The interacting mapping library is an interacting mapping library between rotary knob operations and operation instructions, in which a clockwise rotation of the rotary knob corresponds to an upward page-turning instruction, an upward scrolling instruction, an number increasing scrolling instruction, or a zoom-out instruction; an anticlockwise rotation of the rotary knob corresponds to a downward page-turning instruction, a downward scrolling instruction, a number reducing scrolling instruction, or a zoom-in instruction; a rate of the clockwise rotation of the rotary knob corresponds to an upward page-turning rate, an upward scrolling rate or a zoom-out magnification; a rate of the anticlockwise rotation of the rotary knob corresponds to a downward page-turning rate, a downward scrolling rate or a zoom-in magnification; a change of the pressing displacement of the rotary knob corresponds to a confirming function of an enter key.

In the smart watch interacting method, the smart watch and the photoelectric rotary knob assembly of the embodiments, the photoelectric sensor 60 is used in combination with design principle of a traditional watch crown. By capturing different rotary knob actions on the rotary knob 20 with the photoelectric sensor 60, determining systematic operations corresponding to the rotary knob 20 actions and displaying interacting operations on the user interface of the smart watch, the interactive control is completed. The smart watch of the embodiments may slide the user interface upwards and downwards, and realize zoom-in and zoom out functions precisely and sensitively by operating the rotary knob hardware. The bottleneck problem of touch screen interaction brought by small size of the smart watch screen may be solved by hardware interactions with high-precision interactive controls and simple operations.

Disclosures above only describe embodiments of the present application, and should not be deemed as limiting the protection scope of the present application. Equivalent structures or procedures made based on the specification and drawings, or applied to alternative associated technical areas directly or indirectly should also fall within the protection scope of the present application.

What is claimed is:

1. A smart watch interacting method, comprising:
    obtaining a rotation direction and rate information of a rotary knob;
    obtaining a displacement information of the rotary knob;
    querying an interacting mapping library to determine an operation instruction according to the rotation direction, rate information and the displacement information of the rotary knob; and
    displaying an interacting operation on a user interface according to the operation instruction;
    obtaining the rotation direction and rate information comprises obtaining the rotation direction and rate information via a photoelectric sensor; obtaining the displacement information of the rotary knob comprises obtaining the displacement information of the rotary knob via the photoelectric sensor;
    wherein the photoelectric sensor comprises a laser light source unit and an image detecting unit, the laser light source unit emitting laser light and illuminating on a surface of the rotary knob, the image detecting unit determining the rotation direction and rate information of the rotary knob based on the light reflected by the surface of the rotary knob;
    wherein the laser light source unit and the image detecting unit are both arranged inside a three-dimensional sensing chamber formed by the photoelectric sensor.

2. The smart watch interacting method of claim 1, wherein the interacting mapping library is a mapping library between rotary knob operations and operation instructions, in which a clockwise rotation of the rotary knob corresponds to an upward page-turning instruction, an upward scrolling instruction, an number increasing scrolling instruction, or a zoom-out instruction; an anticlockwise rotation of the rotary knob corresponds to a downward page-turning instruction, a downward scrolling instruction, a number reducing scrolling instruction, or a zoom-in instruction; a rate of the clockwise rotation of the rotary knob corresponds to an upward page-turning rate, an upward scrolling rate or a zoom-out magnification; a rate of the anticlockwise rotation of the rotary knob corresponds to a downward page-turning rate, a downward scrolling rate or a zoom-in magnification; a change of a pressing displacement of the rotary knob corresponds to a confirming function of an enter key.

3. A smart watch, comprising a controller, an LCD interface connected to the controller, wherein the smart watch further comprises a photoelectric rotary knob assembly having a rotary knob; the controller comprises an obtaining module, a mapping module and an interacting module;
    the obtaining module is configured to obtain a rotation direction and rate information of the rotary knob, and obtain a displacement information of the rotary knob;
    the mapping module is configured to query an interacting mapping library to determine an operation instruction according to the rotation direction, rate information and the displacement information of the rotary knob;
    the interacting module is configured to display an interacting operation on the LCD interface according to the operation instruction;
    wherein the photoelectric rotary knob assembly further comprises a photoelectric sensor connected to the controller, the photoelectric sensor being configured to obtain the rotation direction and rate information of the rotary knob, and further configured to obtain the displacement information of the rotary knob;
    wherein the photoelectric sensor comprises a laser light source unit and an image detecting unit, the laser light source unit emitting laser light and illuminating on a surface of the rotary knob, the image detecting unit determining the rotation direction and rate information of the rotary knob based on the light reflected by the surface of the rotary knob;
    wherein the laser light source unit and the image detecting unit are both arranged inside a three-dimensional sensing chamber formed by the photoelectric sensor.

4. The smart watch of claim 3, wherein the interacting mapping library is a mapping library between rotary knob operations and operation instructions, in which a clockwise rotation of the rotary knob corresponds to an upward page-turning instruction, an upward scrolling instruction, an number increasing scrolling instruction, or a zoom-out instruction; an anticlockwise rotation of the rotary knob corresponds to a downward page-turning instruction, a downward scrolling instruction, a number reducing scrolling instruction, or a zoom-in instruction; a rate of the clockwise rotation of the rotary knob corresponds to an upward page-turning rate, an upward scrolling rate or a zoom-out magnification; a rate of the anticlockwise rotation of the rotary knob corresponds to a downward page-turning rate, a downward scrolling rate or a zoom-in magnification; a change of a pressing displacement of the rotary knob corresponds to a confirming function of an enter key.

5. A photoelectric rotary knob assembly, which is mounted on a watch case, comprising a rotary knob and a photoelectric sensor; the rotary knob comprises a rotary cap and a detection rod extending from the rotary cap, the detection rod extending into the photoelectric sensor, the photoelectric sensor being connected to the controller, wherein the photoelectric sensor is configured to obtain a rotation direction and rate information of the detection rod, and obtain a displacement information of the detection rod; the controller is configured to query an interacting mapping library to determine an operation instruction according to the rotation direction and rate information and the displacement information, and display an interacting operation on the LCD interface according to the operation instruction;

wherein the photoelectric sensor comprises a laser light source unit and an image detecting unit, the laser light source unit emitting laser light and illuminating on a surface of the rotary knob, the image detecting unit determining the rotation direction and rate information of the rotary knob based on the light reflected by the surface of the rotary knob;

wherein the laser light source unit and the image detecting unit are both arranged inside a three-dimensional sensing chamber formed by the photoelectric sensor.

6. The photoelectric rotary knob assembly of claim 5, wherein the watch case forms a crown tube, a mounting ring slot arranged around the crown tube; the rotary cap defines a ring receiving chamber; the detection rod of the rotary knob passes through the crown tube such that the crown tube is received in the receiving chamber; at the same time, an elastic element is mounted between the mounting ring slot and the rotary cap.

7. The photoelectric rotary knob assembly of claim 6, wherein an inner chamber of the crown tube is provided with at least one seal ring, and a jump ring is arranged where the detection rod passes through the watch case.

8. The photoelectric rotary knob assembly of claim 5, wherein the interacting mapping library is a mapping library between rotary knob operations and operation instructions, in which a clockwise rotation of the rotary knob corresponds to an upward page-turning instruction, an upward scrolling instruction, an number increasing scrolling instruction, or a zoom-out instruction; an anticlockwise rotation of the rotary knob corresponds to a downward page-turning instruction, a downward scrolling instruction, a number reducing scrolling instruction, or a zoom-in instruction; a rate of the clockwise rotation of the rotary knob corresponds to an upward page-turning rate, an upward scrolling rate or a zoom-out magnification; a rate of the anticlockwise rotation of the rotary knob corresponds to a downward page-turning rate, a downward scrolling rate or a zoom-in magnification; a change of a pressing displacement of the rotary knob corresponds to a confirming function of an enter key.

* * * * *